United States Patent
Yamaoka et al.

(10) Patent No.: US 7,294,448 B2
(45) Date of Patent: *Nov. 13, 2007

(54) COMPOSITION SENSITIVE TO VISIBLE LIGHT

(75) Inventors: Tsuguo Yamaoka, Funabashi (JP); Katsuhiro Ito, Yokkaichi (JP); Takeshi Iwasaki, Ichihara (JP); Ikuo Shimizu, Yokkaichi (JP)

(73) Assignee: Kyowa Hakko Kogyo Co., Ltd., Tokyo (JP)

( * ) Notice: Subject to any disclaimer, the term of this patent is extended or adjusted under 35 U.S.C. 154(b) by 27 days.

This patent is subject to a terminal disclaimer.

(21) Appl. No.: 10/523,523

(22) PCT Filed: Aug. 20, 2003

(86) PCT No.: PCT/JP03/10534

§ 371 (c)(1),
(2), (4) Date: Feb. 4, 2005

(87) PCT Pub. No.: WO2004/019131

PCT Pub. Date: Mar. 4, 2004

(65) Prior Publication Data

US 2006/0003259 A1  Jan. 5, 2006

(30) Foreign Application Priority Data

Aug. 20, 2002  (JP)  ............... 2002-238714

(51) Int. Cl.
*G03C 1/00* (2006.01)

(52) U.S. Cl. .................. 430/270.1; 568/591

(58) Field of Classification Search ............ 430/270.1, 430/281.1; 568/591
See application file for complete search history.

(56) References Cited

U.S. PATENT DOCUMENTS

| 5,072,029 A * | 12/1991 | Hertler ................... 560/225 |
| 5,563,011 A * | 10/1996 | Shipley ....................... 430/7 |
| 5,747,790 A * | 5/1998 | Shimomura et al. ..... 250/208.1 |
| 5,852,208 A * | 12/1998 | Rongione .................. 560/231 |
| 5,919,599 A * | 7/1999 | Meador et al. .......... 430/271.1 |
| 5,928,841 A * | 7/1999 | Ushirogouchi et al. ..... 430/325 |
| 5,938,841 A * | 8/1999 | Kitagawa et al. .......... 117/208 |
| 6,124,077 A   | 9/2000  | Imai et al. ............... 430/281.1 |
| 6,156,477 A * | 12/2000 | Motomi et al. .......... 430/270.1 |
| 6,156,479 A * | 12/2000 | Meador et al. .......... 430/270.1 |
| 6,168,897 B1 * | 1/2001 | Ushirogouchi et al. ..... 430/139 |
| 6,200,725 B1 * | 3/2001 | Takechi et al. .......... 430/270.1 |
| 6,468,718 B1 * | 10/2002 | Kang et al. ............... 430/281.1 |
| 6,660,450 B2 * | 12/2003 | Okino et al. ............. 430/270.1 |
| 6,753,449 B2 * | 6/2004 | Guo ........................... 568/417 |
| 6,835,889 B2 * | 12/2004 | Hiraoka et al. ............. 174/52.2 |
| 7,015,363 B2 * | 3/2006 | Shimizu et al. ............. 568/591 |
| 2004/0181097 A1* | 9/2004 | Shimizu et al. ............. 568/591 |
| 2006/0074262 A1* | 4/2006 | Shimizu et al. ............. 568/594 |

FOREIGN PATENT DOCUMENTS

JP  2002-169275  6/2002
WO  WO 03/006407  1/2003

OTHER PUBLICATIONS

Journal of the Adhesion Society of Japan, vol. 34, No. 7 (1998).*

* cited by examiner

*Primary Examiner*—Cynthia Kelly
*Assistant Examiner*—Connie P. Johnson
(74) *Attorney, Agent, or Firm*—Fitzpatrick, Cella, Harper & Scinto

(57) ABSTRACT

The present invention provides a visible light-sensitive composition which is highly sensitive to a visible light and is useful as an electronic circuit forming material, a lithographic printing material, etc., said visible light-sensitive composition comprising (a) a polymer comprising a repeating unit represented by general formula (I):

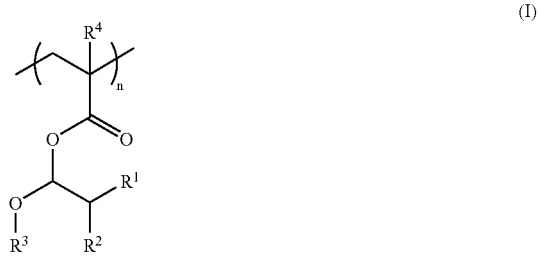

wherein $R^1$, $R^2$, and $R^3$ are the same or different and each represents substituted or unsubstituted alkyl, substituted or unsubstituted aryl, or substituted or unsubstituted aralkyl, or alternatively $R^1$ and $R^2$ form cycloalkyl together with the adjacent carbon atom, and $R^4$ represents lower alkyl, (b) a compound that generates an acid by visible light irradiation and (c) a sensitizing dye.

5 Claims, No Drawings

COMPOSITION SENSITIVE TO VISIBLE LIGHT

TECHNICAL FIELD

The present invention relates to a visible light-sensitive composition useful for an electronic circuit forming material, a lithographic printing material, production of a filter for a color display device such as a liquid crystal display or a plasma display, etc.

BACKGROUND ART

Recently, positive photoresists have been widely used for forming electronic circuit patterns, and in most of the positive photoresists a composition containing a novolak resin and a naphthoquinone diazide compound as a photosensitive agent is used. In the composition, the novolak resin can be dissolved in an aqueous alkaline solution without swelling. The naphthoquinone diazide compound acts to reduce the alkali solubility of the novolak resin, while the compound is decomposed by irradiation of ultraviolet ray, etc. and converted into indene carboxylic acid to increase the alkali solubility of the novolak resin, and thus the composition is useful as the positive photoresist. However, this composition is poor in reactivity to a visible light, and disadvantageous in that sufficient resolution cannot be achieved in the case of forming a fine pattern.

Photosensitive compositions comprising a compound capable of generating an acid by light irradiation, a compound having a group derived from a polyfunctional vinyl ether compound, etc., are disclosed in JP-A-6-295064, JP-A-7-146552, JP-A-11-153858, and JP-A-11-174680. However, these compositions have disadvantages of poor yield, which is due to decrease of thermal crosslinking efficiency by diffusion limitation, and poor storage stability.

Also in the field of planography, in recent years there has been increasing interest in lithographic printing materials capable of directly plate-making using a visible laser or an infrared laser instead of conventional systems utilizing an ultraviolet light. JP-A-7-186562 and WO 02/11996 disclose photothermal type positive plate-making materials using an infrared laser. However, since these materials use a long wavelength laser as a light source, these materials are disadvantageous in view point of obtaining high resolution.

As a stable, high-energy laser, which is presently used in the above applications, those having an output wavelength within the visible region are often used, and examples thereof include an argon ion laser having oscillation lines at the wavelengths of 488 nm and 514.5 nm and a YAG laser having an emission line at 532 nm as the second high harmonic wave. Accordingly, there is a demand for a compound having a high sensitivity to these wavelengths.

DISCLOSURE OF THE INVENTION

An object of the present invention is to provide a photosensitive composition having a high sensitivity to a visible light, which is useful as an electronic circuit forming material, a lithographic printing material, etc.

The present invention provides the following (1) to (4).
(1) A visible light-sensitive composition comprising (a) a polymer comprising a repeating unit represented by general formula (I):

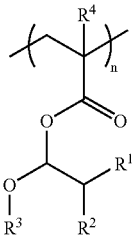

wherein $R^1$, $R^2$ and $R^3$ are the same or different and each represents substituted or unsubstituted alkyl, substituted or unsubstituted aryl, or substituted or unsubstituted aralkyl, or alternatively $R^1$ and $R^2$ form cycloalkyl together with the adjacent carbon atom, and $R^4$ represents lower alkyl, (b) a compound that generates an acid by visible light irradiation, and (c) a sensitizing dye.
(2) The visible light-sensitive composition according to (1), wherein the polymer comprising a repeating unit represented by general formula (I) has a number average molecular weight of 1,000 to 100,000.
(3) The visible light-sensitive composition according to (1) or (2), which comprises 0.1 to 40 parts by weight of the compound that generates an acid by visible light irradiation per 100 parts by weight of the polymer comprising a repeating unit represented by general formula (I).
(4) The visible light-sensitive composition according to any one of (1) to (3), which comprises 0.1 to 10 parts by weight of the sensitizing dye per 100 parts by weight of the polymer comprising a repeating unit represented by general formula (I).

In the definitions of the groups in general formula (I), the alkyl includes straight or branched alkyl having 1 to 18 carbon atoms, and specific examples thereof are methyl, ethyl, propyl, isopropyl, butyl, isobutyl, sec-butyl, tert-butyl, pentyl, hexyl, heptyl, octyl, nonyl, decyl, dodecyl, octadecyl, etc, among these, the alkyl having 1 to 6 carbon atoms is preferred, and the alkyl having 1 to 3 carbon atoms is more preferred.

The lower alkyl includes straight or, branched alkyl having 1 to 8 carbon atoms, and examples thereof are methyl, ethyl, propyl, isopropyl, butyl, isobutyl, sec-butyl, tert-butyl, pentyl, hexyl, heptyl, octyl, etc.

The cycloalkyl formed by $R^1$ and $R^2$ together with the adjacent carbon atom includes cycloalkyl having 3 to 8 carbon atoms, and examples thereof are cyclopropyl, cyclobutyl, cyclopentyl, cyclohexyl, cycloheptyl, cyclooctyl, etc.

The aryl includes aryl having 6 to 12 carbon atoms, and examples thereof are phenyl, naphtyl, etc.

The aralkyl includes aralkyl having 7 to 15 carbon atoms, and examples thereof are benzyl, phenethyl, naphtylmethyl, naphtylethyl, etc.

Examples of the substituents in the substituted alkyl are lower alkoxy, lower alkanoyl, cyano, nitro, halogen, lower alkoxycarbonyl, etc. Examples of the alkyl moieties of the lower alkoxy, the lower alkanoyl, and the lower alkoxycarbonyl are the same as those of the lower alkyl described above. The halogen means, fluorine, chlorine, bromine, and iodine atoms.

Examples of the substituents in the substituted aryl and the substituted aralkyl include lower alkyl, lower alkoxy, lower alkanoyl, cyano, nitro, halogen, lower alkoxycarbonyl, etc. Examples of the lower alkyl, the lower alkoxy, the lower alkanoyl, the halogen, and the lower alkoxycarbonyl are the same as described above, respectively.

The polymer comprising the repeating unit represented by general formula (I) may be produced by subjecting that an unsaturated ester represented by the general formula (IV):

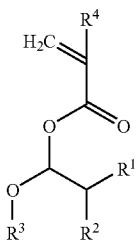

wherein $R^1$, $R^2$, $R^3$, and $R^4$ have the same meaning as defined to radical polymerization or ionic polymerization above, each is polymerized singly or with the other copolymerizable monomer according to a method described in Shin Kobunshi Jikkengaku 2, Kobunshi no Gosei Hanno (1), edited by The Society of Polymer Science, Japan, pages 1 to 224, Jun. 15, 1995, etc. Examples of the other copolymerizable monomers include aromatic vinyl compounds such as styrene and hydroxystyrene; α,β-unsaturated carboxylic acids such as acrylic acid, methacrylic acid, itaconic acid, mesaconic acid, maleic acid, and fumaric acid; α,β-unsaturated esters such as methyl acrylate, methyl methacrylate, hydroxyethyl acrylate, and hydroxyethyl methacrylate; etc.

The polymer comprising the repeating unit represented by general formula (I) is hereinafter referred to as polymer (I) in some cases.

In the production of polymer (I), the unsaturated ester represented by general formula (IV) is used 10% in an amount of preferably by weight or more, more preferably 20% by weight or more, based on the total amount of the monomers used.

The number average molecular weight of polymer (I) is preferably 1,000 to 100,000, more preferably 5,000 to 50,000.

As the compound that generates an acid by visible light irradiation, preferably used are compounds represented by general formula (II):

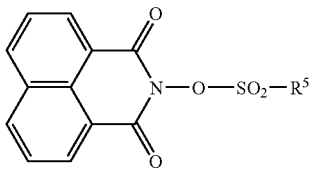

wherein $R^5$ represents substituted or unsubstituted alkyl, substituted or unsubstituted aryl, or substituted or unsubstituted aralkyl. Examples of the substituted or unsubstituted alkyl, the substituted or unsubstituted aryl, and the substituted or unsubstituted aralkyl are the same as those described above.

In the compounds represented by general formula (II), $R^5$ is preferably methyl, trifluoromethyl, or p-methylphenyl, and more preferably trifluoromethyl.

The compound that generates an acid by visible light irradiation is hereinafter referred to as the photo-acid-generating agent in some cases.

As the sensitizing dye, preferably used are compounds represented by general formula (III):

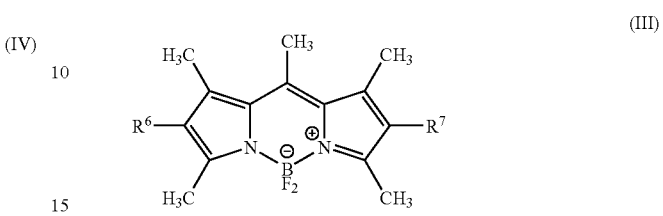

wherein $R^6$ and $R^7$ are the same or different and each represent a hydrogen atom or lower alkyl. Examples of the lower alkyl are the same as those described above. In the compounds represented by general formula (III), compounds wherein $R^6$ and $R^7$ are the same or different and each represents a hydrogen atom or ethyl are preferably used. The sensitizing dyes may be produced by a method described in U.S. Pat. No. 4,916,711, U.S. Pat. No. 5,189,029, etc.

The visible light-sensitive composition of the present invention contains polymer (I), the photo-acid-generating agent, and the sensitizing dye, but there are no particular restrictions on the method and order of mixing the components.

The photo-acid-generating agent is used in an amount of preferably 0.1 to 40 parts by weight, more preferably 0.2 to 20 parts by weight, further preferably 0.5 to 15 parts by weight, based on 100 parts by weight of polymer (I).

The sensitizing dye is used in an amount of preferably 0.1 to 10 parts by weight, more preferably 0.2 to 5 parts by weight, further preferably 0.5 to 3 parts by weight, based on 100 parts by weight of polymer (I).

The visible light-sensitive composition of the present invention may contain a solvent, and examples thereof include hydrocarbon solvents such as hexane, toluene, and xylene; ether solvents such as dioxane and tetrahydrofuran; ketone solvents such as acetone, methyl ethyl ketone, methyl isobutyl ketone, and cyclohexanone; alcohol solvents such as isopropyl alcohol, butanol, hexanol, octanol, and benzyl alcohol; glycol solvents such as ethylene glycol, propylene glycol, ethylene glycol monomethyl ether, ethylene glycol monoethyl ether, propylene glycol monomethyl ether, propylene glycol monoethyl ether, propylene glycol monomethyl ether acetate; etc. These solvents may be used alone or as a mixture of 2 or more solvents, and the solvents is used in an amount of preferably 1 to 100 parts by weight per one part by weight of polymer (I).

Pattern formation using the visible light-sensitive composition of the present invention may be carried out in the following manner. First, the visible light-sensitive composition of the present invention is applied onto a substratum such as an aluminum plate, a copper plate, and a silicon wafer by a spin coating method, a bar coating method, or a spray coating method, and is heated preferably at 80 to 130° C. for 1 to 30 minutes for drying a coating film. Then, the coating film formed on the substratum is irradiated imagewise with a visible light using a positive photomask, a reduced projection exposure apparatus, a direct drawing apparatus, etc. As, the visible light, preferably used are an argon ion laser having oscillation lines at the wavelengths of 488 nm and 514.5 nm, a YAG laser having an emission line of a second high harmonic wave at 532 nm, etc.

After the visible light irradiation, the coating film is preferably heated at 50 to 150° C. for 1 to 30 minutes, and then developed by using an alkaline solution of tetramethylammonium hydroxide (TMAH), an alkanolamine such as ethanolamine, an inorganic alkali such as sodium hydroxide, sodium carbonate, sodium hydrogen carbonate, and sodium metasilicate, etc.

As a result, a positive pattern with an excellent dimensional accuracy and a high resolution is formed on the surface of substratum.

The pattern formed in this manner is useful for forming an electronic circuit, a lithographic printing plate, a filter for a color display such as a liquid crystal display and a plasma display, etc. Particularly, the visible light-sensitive composition of the present invention is remarkably high in the sensitivity, and by using the visible light-sensitive composition of an exposure time is shortened to increase the working efficiency and a finer pattern can be formed.

BEST MODE FOR CARRYING OUT THE INVENTION

The present invention will be described in more detail below with reference to Examples and Reference Examples.

In Reference Examples, number average molecular weights (Mn) of polymers were measured by a gel permeation chromatography under the following conditions. Column: Two TSKgel Super HM-M columns and one HM-H column (both available from Tosoh Corporation) connected in series.

Column temperature: 40° C.

Detector: RI

Developing solvent: Tetrahydrofuran (flow rate 0.5 ml/minute)

Reference substance: Polystyrene

Sensitivities of photosensitive compositions were calculated using the following equation:

Sensitivity=$I_o \times 10^{-A} \times t$ $I_o$: Exposure intensity (mJ/cm$^2$·second)

A: Optical density of step tablet t: Exposure time (second)

REFERENCE EXAMPLE 1

Synthesis of Polymer A 8.5 g of 1-n-propoxy-2-methylpropyl methacrylate, 25.0 g of methyl methacrylate, and 1.1 g of 2,2'-azobis(2-methylbutyronitrile) (AMBN) were dissolved in 15.0 g of methyl isobutyl ketone. The mixture was added dropwise to 35.0 g of methyl isobutyl ketone heated at 70° C. over 2 hours, and polymerized at 70° C. for 3 hours. Then, 83.0 g of methyl isobutyl ketone was added to the reaction mixture and cooled to the room temperature. The resultant reaction mixture was added to 3 L of methanol dropwise at the room temperature to precipitate a polymer, and then filtered to obtain 20.8 g of the polymer having a number average molecular weight of 16,000.

REFERENCE EXAMPLE 2

Synthesis of Polymer B 7.3 g of 1-n-methoxy-2-methylpropyl methacrylate, 22.1 g of methyl methacrylate, 4.1 g of 2-hydroxyethyl methacrylate, and 1.1 g of AMBN were dissolved in 15.0 g of propylene glycol monomethyl ether acetate (PMA). The mixture added dropwise to 35.0 g of PMA heated at 70° C. over 2 hours, and The monomers were polymerized at 70° C. for 3 hours, and then 83.0 g of PMA was added to the reaction mixture and cooled to the room temperature. The resultant reaction mixture was added dropwise to 3 L of methanol at the room temperature to precipitate a polymer, and filtered to obtain 21.2 g of the polymer having a number average molecular weight of 13,500.

EXAMPLE 1

Production and Evaluation of Photosensitive Composition 100 parts by weight of polymer A synthesized in Reference Example 1 was dissolved in 466 parts by weight of cyclohexanone, and to 1 part by weight of 4,4-difluoro-1,3,5,7,8-pentamethyl-4-bora-3a,4a-diaza-s-indacene and 5 parts by weight of NAI-105 (a photo-acid-generating agent, available from Midori Kagaku Kogyo Co., Ltd.) were added thereto to prepare a photosensitive composition. The photosensitive composition was applied onto an aluminum plate, which had been subjected to grinding and anodizing treatment, using a spin coating method, and prebaked at 100° C. for 10 minutes, to obtain a photosensitive layer having a thickness of about 1 μm. A step tablet was adhered to the obtained photosensitive layer, and the obtained layer was irradiated with an argon ion laser (Spectraphysic Stabilite 2016) having an intensity of 2.0 mJ/cm$^2$·second, heated at 120° C. for 10 minutes, and developed for 1 minute by using a mixture of a 2.38 weight % aqueous solution of tetramethylammonium hydroxide and isopropyl alcohol (mixing ratio 1/1). Then, the minimum energy amount required for the photosensitization was obtained as a sensitivity from a step with the maximum density, in which the polymer film of the photosensitive layer was dissolved. The sensitivity of the photosensitive composition was 0.52 mJ/cm$^2$ to the wavelength of 488 nm, and 1.22 mJ/cm$^2$ to the wavelength of 514.5 nm.

EXAMPLE 2

Production and Evaluation of Photosensitive Composition 100 parts by weight of polymer A synthesized in Reference Example 1 was dissolved in 466 parts by weight of cyclohexanone, and 1 part by weight of 2,6-diethyl-4,4-difluoro-1,3,5,7,8-pentamethyl-4-bora-3a,4a-diaza-s-indacene and 5 parts by weight of NAI-105 (a photo-acid-generating agent, available from Midori Kagaku Kogyo Co., Ltd.) were added thereto to prepare a photosensitive composition. The photosensitive composition was applied onto an aluminum plate, which had been subjected to grinding and anodizing treatment, using a spin coating method, and then prebaked at 100° C. for 10 minutes, to obtain a photosensitive layer having a thickness of about 1 μm. A step tablet was adhered to the obtained photosensitive layer, and the obtained layer was irradiated with an argon ion laser (Spectraphysic Stabilite 2016) having an intensity of 2.0 in J/cm²·second, heated at 120° C. for 10 minutes, and developed for 1 minute by using a mixture of a 2.38 weight % aqueous solution of tetramethylammonium hydroxide and isopropyl alcohol (mixing ratio 1/1). Then, the minimum energy amount required for the photosensitization was obtained as a sensitivity from a step with the maximum density, in which the polymer film of the photosensitive layer was dissolved. The sensitivity of the photosensitive composition was 1.58 mJ/cm² to the wavelength of 488 nm, and 1.97 mJ/cm² to the wavelength of 514.5 nm.

EXAMPLE 3

Production and Evaluation of Photosensitive Composition 100 parts by weight of polymer B synthesized in Reference Example 2 was dissolved in 466 parts by weight of PMA, and 0.1 part by weight of 2,6-diethyl-4,4-difluoro-1,3,5,7,8-pentamethyl-4-bora-3a,4a-diaza-s-indacene and 5 parts by weight of NAI-105 (a photo-acid-generating agent, available from Midori Kagaku Kogyo Co., Ltd.) were added thereto to prepare a photosensitive composition. The photosensitive composition was applied onto an aluminum plate, which had been subjected to grinding and anodizing treatment, using a spin coating method, and prebaked at 100° C. for 5 minutes, to obtain a photosensitive layer having a thickness of about 1 μm. A step tablet was adhered to the obtained photosensitive layer, and the obtained layer was irradiated with an argon ion laser (Spectraphysic Stabilite 2016) having an intensity of 2.0 mJ/cm²·second, heated at 120° C. for 5 minutes, and developed for 1 minute by using a mixture of a 2.38 weight % aqueous solution of tetramethylammonium hydroxide and isopropyl alcohol (mixing ratio 7/3). Then, the minimum energy amount required for the photosensitization was obtained as a sensitivity from a step with the maximum density, in which the polymer film of the photosensitive layer was dissolved. The sensitivity of the photosensitive composition was 0.90 mJ/cm² to the wavelength of 488 nm.

INDUSTRIAL APPLICABILITY

According to the present invention, a photosensitive composition which is highly sensitive to a visible light, and is useful as an electronic circuit forming material, a lithographic printing material, etc.

The invention claimed is:

1. A visible light-sensitive composition comprising:
   (a) a polymer comprising a repeating unit represented by formula (I):

wherein $R^1$, $R^2$ and $R^3$ independently represent substituted or unsubstituted alkyl, substituted or unsubstituted aryl, or substituted or unsubstituted aralkyl, or alternatively $R^1$ and $R^2$ form cycloalkyl together with the adjacent carbon atom, and $R^4$ represents lower alkyl,
   (b) a compound that generates an acid by visible light irradiation, and
   (c) a sensitizing dye.

2. The visible light-sensitive composition according to claim 1, wherein the polymer comprising a repeating unit represented by formula (I) has a number average molecular weight of 1,000 to 100,000.

3. The visible light-sensitive composition according to claim 1 or 2, which comprises 0.1 to 40 parts by weight of the compound that generates an acid by visible light irradiation per 100 parts by weight of the polymer comprising a repeating unit represented by formula (I).

4. The visible light-sensitive composition according to claim 1 or 2, which comprises 0.1 to 10 parts by weight of the sensitizing dye per 100 parts by weight of the polymer comprising a repeating unit represented by formula (I).

5. The visible light-sensitive composition according to claim 3, which comprises 0.1 to 10 parts by weight of the sensitizing dye per 100 parts by weight of the polymer comprising a repeating unit represented by formula (I).

* * * * *